United States Patent
Xu et al.

(10) Patent No.: US 11,601,642 B2
(45) Date of Patent: Mar. 7, 2023

(54) STRING MATCHING WITH A SINGLE VALUE FROM REFERENCE LOCATIONS

(71) Applicant: TENCENT AMERICA LLC, Palo Alto, CA (US)

(72) Inventors: Xiaozhong Xu, Palo Alto, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 117 days.

(21) Appl. No.: 17/317,173

(22) Filed: May 11, 2021

(65) Prior Publication Data

US 2022/0060685 A1 Feb. 24, 2022

Related U.S. Application Data

(60) Provisional application No. 63/069,275, filed on Aug. 24, 2020, provisional application No. 63/067,260, filed on Aug. 18, 2020.

(51) Int. Cl.
H03M 7/38 (2006.01)
H04N 19/105 (2014.01)
H04N 19/593 (2014.01)
H04N 19/159 (2014.01)
H04N 19/176 (2014.01)
H03M 7/30 (2006.01)
H04N 19/52 (2014.01)

(52) U.S. Cl.
CPC ......... *H04N 19/105* (2014.11); *H04N 19/159* (2014.11); *H04N 19/176* (2014.11); *H04N 19/593* (2014.11); *H03M 7/30* (2013.01); *H04N 19/52* (2014.11)

(58) Field of Classification Search
CPC .. H04N 19/105; H04N 19/159; H04N 19/176; H04N 19/593; H04N 19/52
See application file for complete search history.

(56) References Cited

U.S. PATENT DOCUMENTS

| | | | |
|---|---|---|---|
| 10,542,253 B2 | 1/2020 | Liu et al. | |
| 2015/0264348 A1 | 9/2015 | Zou et al. | |
| 2017/0272745 A1 | 9/2017 | Liu et al. | |
| 2018/0184091 A1 | 6/2018 | Wang et al. | |
| 2020/0021800 A1 | 1/2020 | Kim et al. | |
| 2022/0174310 A1* | 6/2022 | Xu | H04N 19/96 |

OTHER PUBLICATIONS

Xiaozhong Xu et al., "Current Picture Referencing in Versatile Video Coding", IEEE Computer Society, 2019 IEEE Conference on Multimedia Information Processing and Retrieval (MIPR), pp. 26-31.

(Continued)

*Primary Examiner* — Joseph J Lauture
(74) *Attorney, Agent, or Firm* — Sughrue Mion, PLLC

(57) ABSTRACT

A method, computer program, and computer system is provided for coding video data. Video data including one or more reference locations is received. The one or more reference locations are updated in a history list associated with the received video data based on intra block copy for a single value string mode. The video data is decoded based on the updated reference locations.

20 Claims, 10 Drawing Sheets

(56) References Cited

OTHER PUBLICATIONS

Xiaozhong Xu et al., "Intra Block Copy in HEVC Screen Content Coding Extensions", IEEE Journal on Emerging and Selected Topics in Circuits and Systems, 2016, pp. 1-11.
Xiaozhong Xu et al., "Intra block copy in Versatile Video Coding with Reference Sample Memory Reuse", IEEE, 5 pages.
Shan Liu et al., "Overview of HEVC extensions on screen content coding", Industrial Technology Advances, 2015, pp. 1-12, vol. 4.
Wei Pu et al., "Palette Mode Coding in HEVC Screen Content Coding Extension", IEEE Journal on Emerging and Selected Topics in Circuits and Systems, Dec. 2016, pp. 420-432, vol. 6, No. 4.
Yingbin Wang et al., "Intra Block Copy in AVS3 Video Coding Standard", 2020 IEEE, 6 pages.
Rajan Joshi et al., "High Efficiency Video Coding (HEVC) Screen Content Coding: Draft 4", Joint Collaborative Team on Video Coding (JCT-VC) of ITU-T SG 16 WP 3 and ISO/IEC JTC 1/SC 29/WG 11, ISO/IEC 23008-2:2015(E), Document: JCTVC-U1005_r1, Jun. 19-Jun. 26, 2015, 21st Meeting: Warsaw, PL, 663 pages.
Xiang Li et al., "Description of SDR video coding technology proposal by Tencent", Joint Video Experts Team (JVET) of ITU-T SG 16 WP 3 and ISO/IEC JTC 1/SC 29/WG11, Document: JVET-J0029-v1, Apr. 10-20, 2018, San Diego, US, 34 pages.
Benjamin Bross et al., "Versatile Video Coding (Draft 2)", Joint Video Experts Team (JVET) of ITU-T SG 16 WP 3 and ISO/IEC JTC 1/SC 29/WG 11, Document: JVET-K1001-v6, Jul. 10-18, 2018, 11th Meeting: Ljubljana, SI, 141 pages.
Rajan Joshi et al., "Screen content coding test model 1 (SCM 1)", Joint Collaborative Team on Video Coding (JCT-VC) of ITU-T SG 16 WP 3 and ISO/IEC JTC 1/SC 29/WG 11, Document: JCTVC-Q1014, Mar. 27-Apr. 4, 2014, 17th Meeting: Valencia, ES, 5 pages.
International Search Report dated Sep. 8, 2021 in International Application No. PCT/US21/36164.
Written Opinion of the International Searching Authority dated Sep. 8, 2021 in International Application No. PCT/US21/36164.
Extended European Search Report dated Oct. 27, 2022 in European Application No. 21858758.2.
Chun-Chi Chen et al., Intra Line Copy for HEVC Screen Content Intra-Picture Prediction', IEEE Transactions on Circuits and Systems for Video Technology, 2017, vol. 27, No. 7, pp. 1568-1579 (12 pages total).
Xiaozhong Xu et al., "Overview of Screen Content Coding in Recently Developed Video Coding Standards", IEEE, 2020 (11 pages total).
Xiaozhong Xu et al., "CE8: CPR reference memory reuse without increasing memory requirement KCE8.1,2a and CE8.1.2d)", Joint Video Experts Team (JVET) of ITU-T SG 16 WP 3 and ISO/IEC JTC 1 VSC 29/WG 11, 2019, JVET-M0407-v1, 13th Meeting: Marrakesh, MA, 9-18 January (9 pages total).
Wen-Hsiao Peng et al., "Overview of Screen Content Video Coding: Technologies, Standards, and Beyond", IEEE Journal on Emerging and Selected Topics in Circuits and Systems, 2016, vol. 6, No. 4, pp. 393-408 (16 pages total).
Xiaozhong Xu et al., "CE8 CPR reference memory reuse with reduced memory requirement KCE8.1,2b and CE8.1,2c)", Joint Video Experts Team (JVET) of ITU-T SG 16 WP 3 and ISO/IEC JTC 1/SC 29/WG 11, 2019, JVET-M0408-v1, 13th Meeting: Marrakesh, MA, Jan. 9-18, (10 pages total).

\* cited by examiner

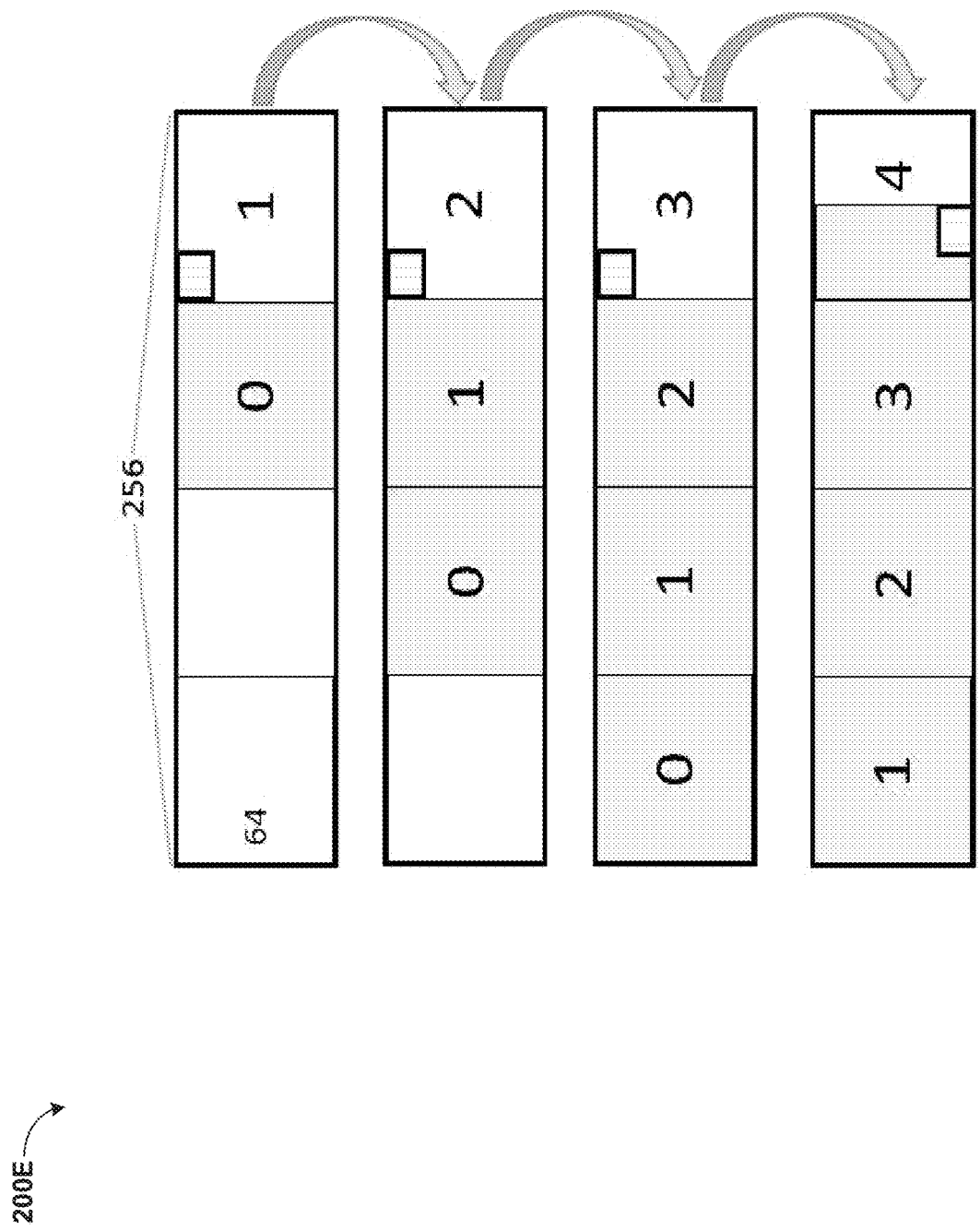

STRING MATCHING WITH A SINGLE VALUE FROM REFERENCE LOCATIONS

CROSS-REFERENCE TO RELATED APPLICATION

This application claims priority based on U.S. Provisional Application Nos. 63/067,260 (filed Aug. 18, 2020) and 63/069,275 (filed Aug. 24, 2020), the entirety of which are incorporated by reference herein.

FIELD

This disclosure relates generally to field of data processing, and more particularly to video encoding and decoding.

BACKGROUND

Block based compensation from a different picture is also known as motion compensation. Similarly, a block compensation can also be done from a previously reconstructed area within the same picture. This is referred as intra picture block compensation, current picture referencing (CPR), or intra block copy (IBC).

SUMMARY

Embodiments relate to a method, system, and computer readable medium for video coding. According to one aspect, a method for video coding is provided. The method may include receiving video data including one or more reference locations. The one or more reference locations are updated in a history list associated with the received video data based on intra block copy for a single value string mode. The video data is decoded based on the updated reference locations.

According to another aspect, a computer system for video coding is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include receiving video data including one or more reference locations. The one or more reference locations are updated in a history list associated with the received video data based on intra block copy for a single value string mode. The video data is decoded based on the updated reference locations.

According to yet another aspect, a computer readable medium for video coding is provided. The computer readable medium may include one or more computer-readable storage devices and program instructions stored on at least one of the one or more tangible storage devices, the program instructions executable by a processor. The program instructions are executable by a processor for performing a method that may accordingly include receiving video data including one or more reference locations. The one or more reference locations are updated in a history list associated with the received video data based on intra block copy for a single value string mode. The video data is decoded based on the updated reference locations.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings:

FIG. 2E is a block diagram of reference sample memory update process of IBC and string matching, according to at least one embodiment;

DETAILED DESCRIPTION

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to video encoding and decoding. The following described exemplary embodiments provide a system, method and computer program to, among other things, encode and decode video data based on updating reference locations. Therefore, some embodiments have the capacity to improve the field of computing by allowing for improved video coding based on using string matching with a single value derived from the reference locations.

As previously described, block based compensation from a different picture is also known as motion compensation. Similarly, a block compensation can also be done from a previously reconstructed area within the same picture. This is referred as intra picture block compensation, current picture referencing (CPR for short), or intra block copy (IBC for short).

However, in the current design for single value string mode, the reference sample locations stored in history list do not have a range limit. Some locations may go beyond the left CTU range as in IBC reference area case. Additionally, the reference sample locations do not update their location information, even if they are referred by recently strings coded in single value string mode. If the reference sample locations in the history buffer for single value string mode is no longer available due to reference sample memory update, that location cannot be used. It may be advantageous, therefore, to use more efficient location representations and update methods in the history list for better usability of the reference samples. To synchronize the reference range for IBC and for string matching, certain range constraint should be imposed on the reference sample locations in the history buffer for single value string mode.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Figure 1:
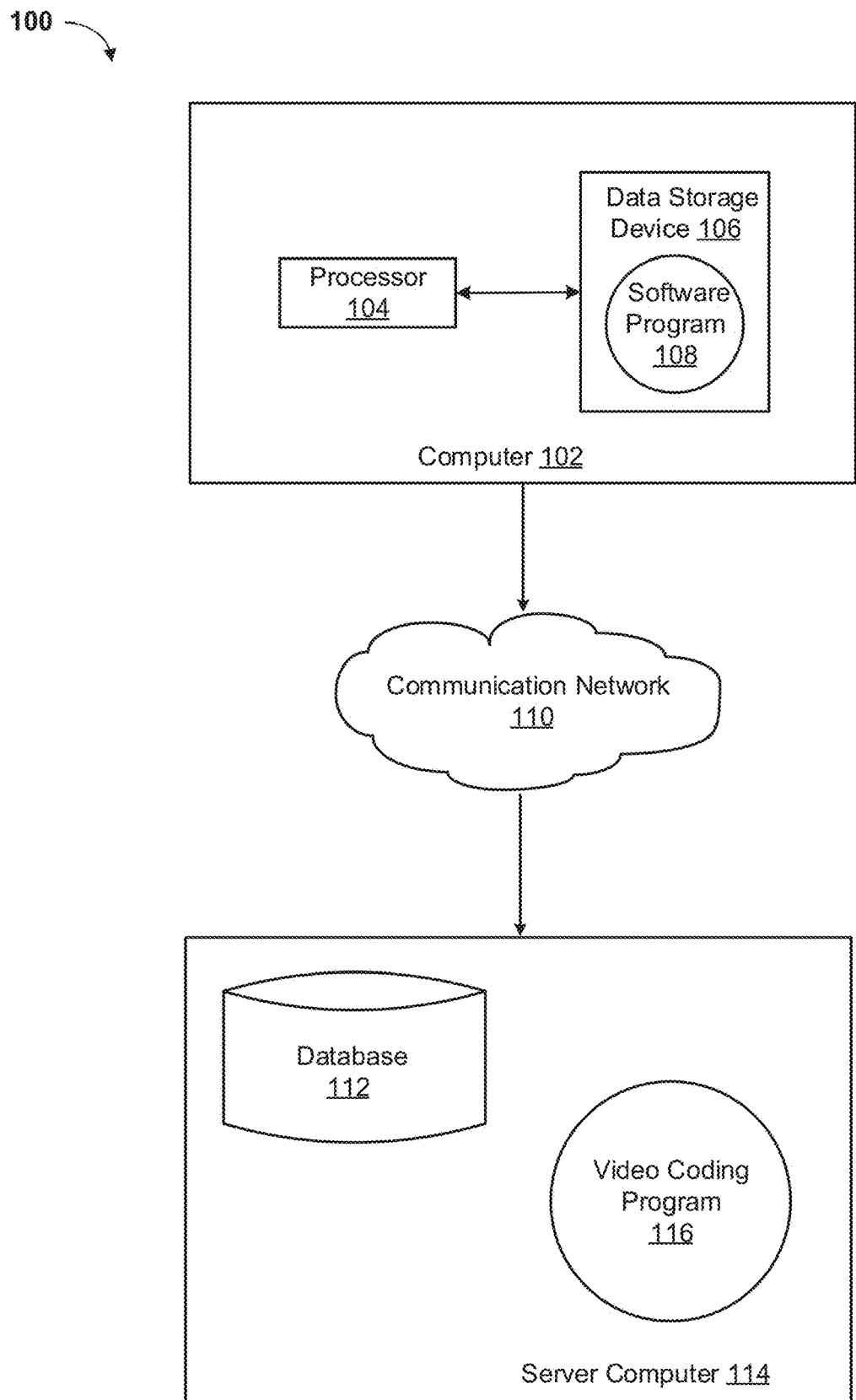
FIG. 1 illustrates a networked computer environment according to at least one embodiment.

The following described exemplary embodiments provide a system, method and computer program that encodes and decodes video data based on string matching. Referring now to FIG. 1, a functional block diagram of a networked computer environment illustrating a video coding system 100 (hereinafter "system") for encoding and decoding video data based on string matching. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 5 and 6. The server computer 114 may also be located in a cloud computing deployment model, such as a private cloud, community cloud, public cloud, or hybrid cloud.

The server computer 114, which may be used for video coding is enabled to run a Video Coding Program 116 (hereinafter "program") that may interact with a database 112. The Video Coding Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger video coding program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2A:
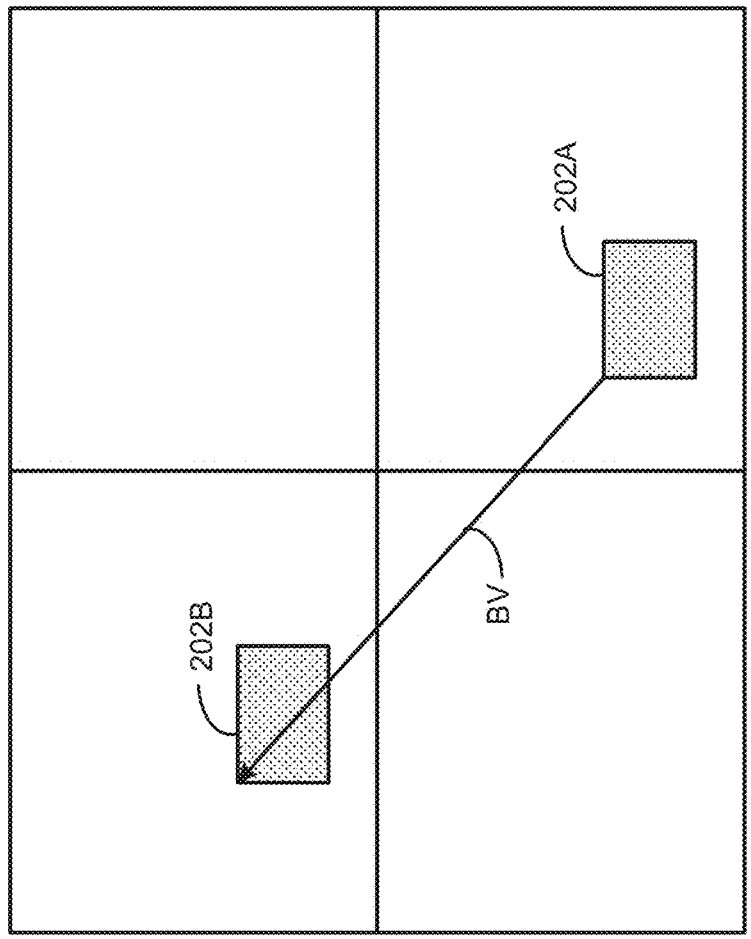
FIG. 2A is a block diagram depicting intra block copy in a picture, according to at least one embodiment.

Referring now to FIG. 2A, a block diagram depicting intra block copy in a picture 200A is depicted. The picture 200A may include a current block 202A, a reference block 202B, and a block vector BV. The block vector BV may be a displacement vector that may indicate an offset between the current block 202A and the reference block 202B. Different from a motion vector in motion compensation, which can be at any value (positive or negative, at either x or y direction), the block vector BV has a few constraints such that it is ensured that the pointed reference block 202B is available and already reconstructed. Also, for parallel processing consideration, some reference area that is tile boundary or wavefront ladder shape boundary is also excluded.

The coding of a block vector could be either explicit or implicit. In the explicit mode (or referred as AMVP mode in inter coding), the difference between a block vector and its predictor is signaled in the implicit mode, the block vector is recovered purely from its predictor, in a similar way as a motion vector in merge mode. The resolution of a block vector, in some implementations, is restricted to integer positions; in other systems, it may be allowed to point to fractional positions The use of intra block copy at block level, can be signaled using a block level flag, refer as an IBC flag. In one embodiment, this flag is signaled when the current block 202A is not coded in merge mode. Or it can be signaled by a reference index approach. This is done by treating the current decoded picture as a reference picture. In HEVC SCC, such a reference picture is put in the last position of the list. This special reference picture is also managed together with other temporal reference pictures in the DPB.

There are also some variations for intra block copy, such as treating the intra block copy as a third mode, which is different from either intra or inter prediction mode. By doing this, the block vector prediction in merge mode and AMVP mode are separated from regular inter mode. For example, a separate merge candidate list is defined for intra block copy mode, where all the entries in the list are all block vectors. Similarly, the block vector prediction list in intra block copy AMVP mode only consists of block vectors. The general rules applied to both lists are: they may follow the same logic as inter merge candidate list or AMVP predictor list in terms of candidate derivation process. For example, the 5 spatial neighboring locations in HEVC or VVC inter merge mode are accessed for intra block copy to derive its own merge candidate list.

Figure 2B:
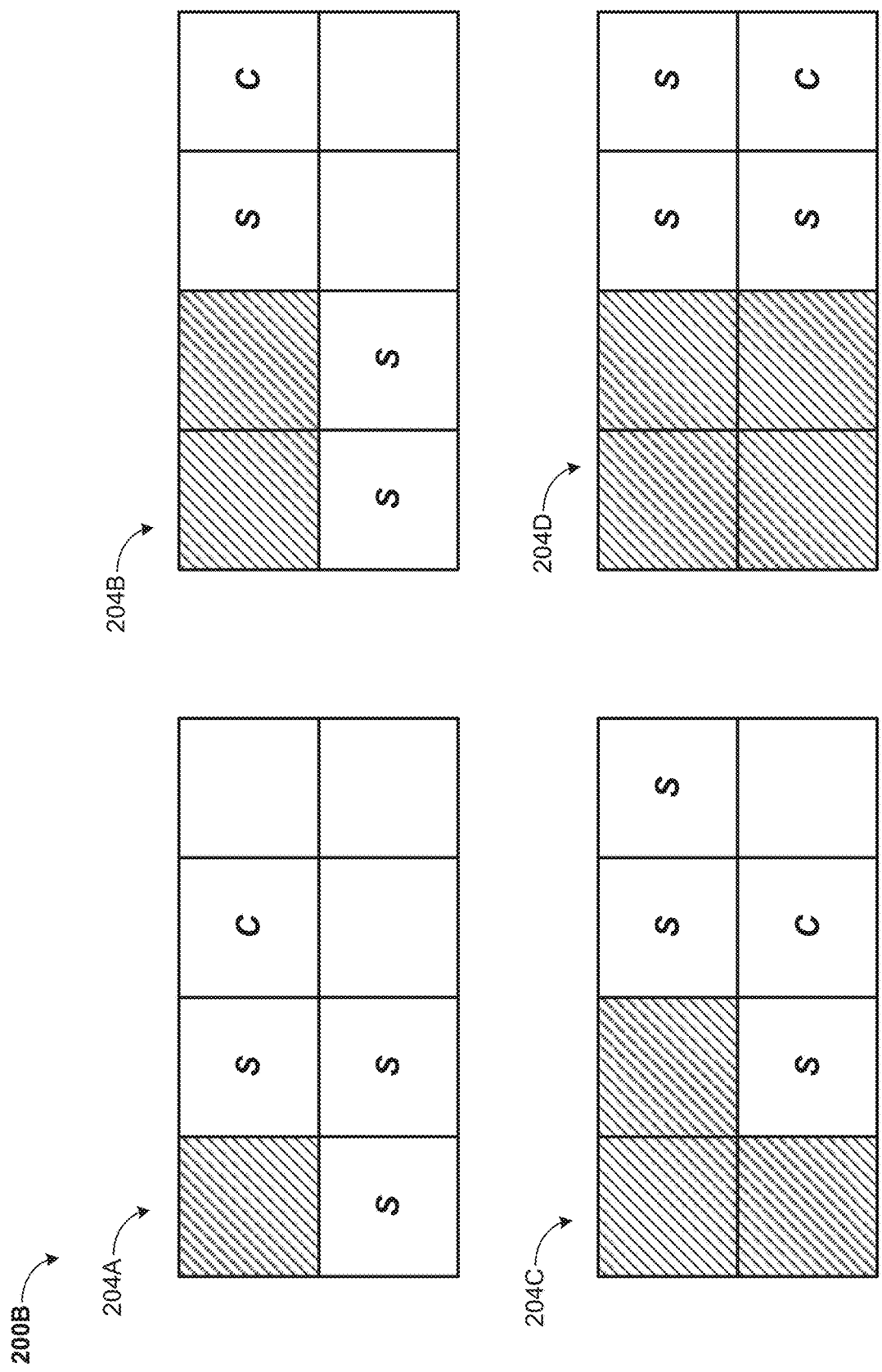
FIG. 2B is a block diagram of intra block compensation with a one coding tree unit (CTU) search range, according to at least one embodiment.

Referring now to FIG. 2B, a block diagram 200B of intra block compensation with a one coding tree unit (CTU) search range is depicted. The search may progress through stages 204A-D. Currently in VVC, the search range of CPR mode is constrained to be within the current CTU. The effective memory requirement to store reference samples for CPR mode is 1 CTU size of samples. Considering the existing reference sample memory to store reconstructed samples in current 64×64 region C, 3 more 64×64 sized reference samples S may be used. Accordingly, the effective search range of the CPR mode may be extended to some part of the left CTU while the total memory requirement for storing reference pixels are kept unchanged (1 CTU size, 4 64×64 reference sample memory in total).

Figure 2C:
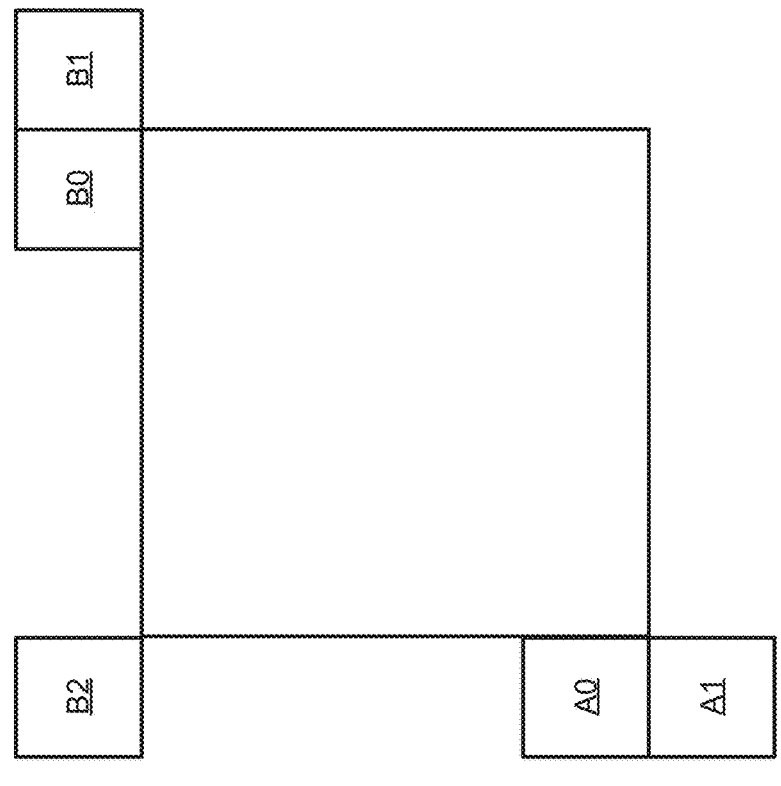
FIG. 2C is a block diagram of HEVC/VVC spatial merge candidates, according to at least one embodiment.

Referring now to FIG. 2C, a block diagram 200C of HEVC/VVC spatial merge candidates is depicted. The five spatial merge candidates for HEVC and VVC may include A0, A1, B0, B1, and B2. The order of forming a candidate list from these positions may be A0->B0->B1->A1->B2.

History-based MVP (HMVP) merge candidates are added to merge list after the spatial MVP and TMVP. In this method, the motion information of a previously coded block is stored in a table and used as MVP for the current CU. The table with multiple HMVP candidates is maintained during the encoding/decoding process. The table is reset (emptied) when a new CTU row is encountered. Whenever there is a non-subblock inter-coded CU, the associated motion information is added to the last entry of the table as a new HMVP candidate.

In VTM3 the HMVP table size S is set to be 6, which indicates up to 6 History-based MVP (HMVP) candidates may be added to the table. When inserting a new motion candidate to the table, a constrained first-in-first-out (FIFO) rule is utilized wherein redundancy check is firstly applied to find whether there is an identical HMVP in the table. If found, the identical HMVP is removed from the table and all the HMVP candidates afterwards are moved forward.

HMVP candidates could be used in the merge candidate list construction process. The latest several HMVP candidates in the table are checked in order and inserted to the candidate list after the TMVP candidate. Redundancy check is applied on the HMVP candidates to the spatial or temporal merge candidate.

To reduce the number of redundancy check operations, one or more simplifications are introduced. A number of HMVP candidates is used for merge list generation is set as (N<=4) ?M: (8-N), wherein N indicates number of existing candidates in the merge list and M indicates number of available HMVP candidates in the table. Once the total number of available merge candidates reaches the maximally allowed merge candidates minus 1, the merge candidate list construction process from HMVP is terminated.

When intra block copy operates as a separate mode from inter mode, a separate history buffer, referred as HBVP, will be used for storing previously coded intra block copy block vectors.

As a separate mode from inter prediction, it is desirable to have a simplified block vector derivation process for intra block copy mode. A similar history-based block vector predictor buffer can be used to perform BV prediction. In the following, some information is provided for some specific usage of such a HBVP.

A HBVP buffer is established to record the previously IBC coded blocks' BV information, including some other side information such as block size, block location, etc.

Based on the recorded information, for each current block, BVs in the HBVP that meet the following conditions are classified into corresponding categories:

Class 0: The area of coded block (width*height) is greater than or equal to the threshold (64 pixels);

Class 1: The frequency of the BV is greater than or equal to 2;

Class 2: The coded block coordinates (upper left corner) are to the left of the current block;

Class 3: The coded block coordinates (upper left corner) are above the current block; Class 4: The coded block coordinates (upper left corner) are at the upper left side of the current block;

Class 5: The coded block coordinates (upper left corner) are at the top right side of the current block;

Class 6: The coded block coordinates (upper left corner) are at the bottom left side of the current block.

For each category, the BV of the most recently coded block is derived as the BV predictor candidate. A CBVP list is constructed by appending the BV predictor of each category in the order from 0 to 6.

A coded block may be divided into several continuous strings, each of which is followed by the next string along a scan order. The scan order can be raster scan or traverse scan. For each string, an string offset vector (SV) and the length of the string are signalled. The SV is used to indicate where the reference string is from in the reference area. The length is used to indicate how long the current/reference string is. An example of the string matching or string copy mode may include an 8×8 CU being divided into two strings using raster scan order. A String® may include a first 29 samples, while a String1 may include the last 35 samples. References for string0 and string1 are indicated by the corresponding String offset Vectors (SV0 and SV1). An already reconstructed area may be used for reference. If a sample in the current block cannot find its match in the reference area, an escape sample is signaled, and its value is coded directly.

In one particular string matching mode, all samples in one single string share the same value. This mode is also referred to as single value string mode. In this mode, a string vector is used to indicate where the value for this string is from in the reference area. To improve the single string mode, instead of signaling the string vector for this mode, a list of recently occurred decoded sample values are used to form a history-based list. In this history list, recently occurred sample locations (x and y coordinates relative to the top-left corner of current picture) are stored. An index pointing to one particular entry in the history list means the corresponding samples in the referred location will be used for single value string mode. This index will be sent in bitstream.

If the value of single value string mode cannot be found from the history-based list, the value will be signaled directly in the bitstream. This value is referred as new single value. For a coding block, several strings can be coded in single value string mode. A set new single values are signaled at coding block level. A candidate set with size M is formed by combining the history-based list (with size P, P can be larger than M) and the signaled new single values for the current coding block. For each entry in the history-based list, a reuse-flag is signaled to tell if this entry will be used to predict the current block. Assuming N (N<=a fixed size M) such entries are selected and reused, and is referred as history-based candidate set. An index will be sent in the bitstream for selecting the prediction sample value. If the index with value in the range of [0, N−1], that indicates one particular entry in the history-based candidate set is selected for predicting the single value string mode. Otherwise, if the index is greater than N, new single values need to be decoded from the bitstream to do the prediction. The index range is constrained to be in [0, M−1] so the overall candidates for the prediction will not exceed M entries. The corresponding samples in the referred location or from the bitstream will be used for single value string mode.

The maintenance of this history list may follow a FIFO mechanism. When the history list is full and new entries are putting in, oldest entries may be removed from the list. When accessing entries in the list, the newest entry may be assigned with smallest index value (or the other way around).

For each new coding block, a set of reuse flags may be signaled to indicate which of the entries in the history-based list will be used for current block, together with the signaled new single values. After coding of current block, the history-based list will be updated by the established candidate set (combination of history-based list and signaled new single values, as mentioned above) for current block. Those entries in the history-based list that are not marked as reused, may be discard after coding of the current block.

Figure 2D:
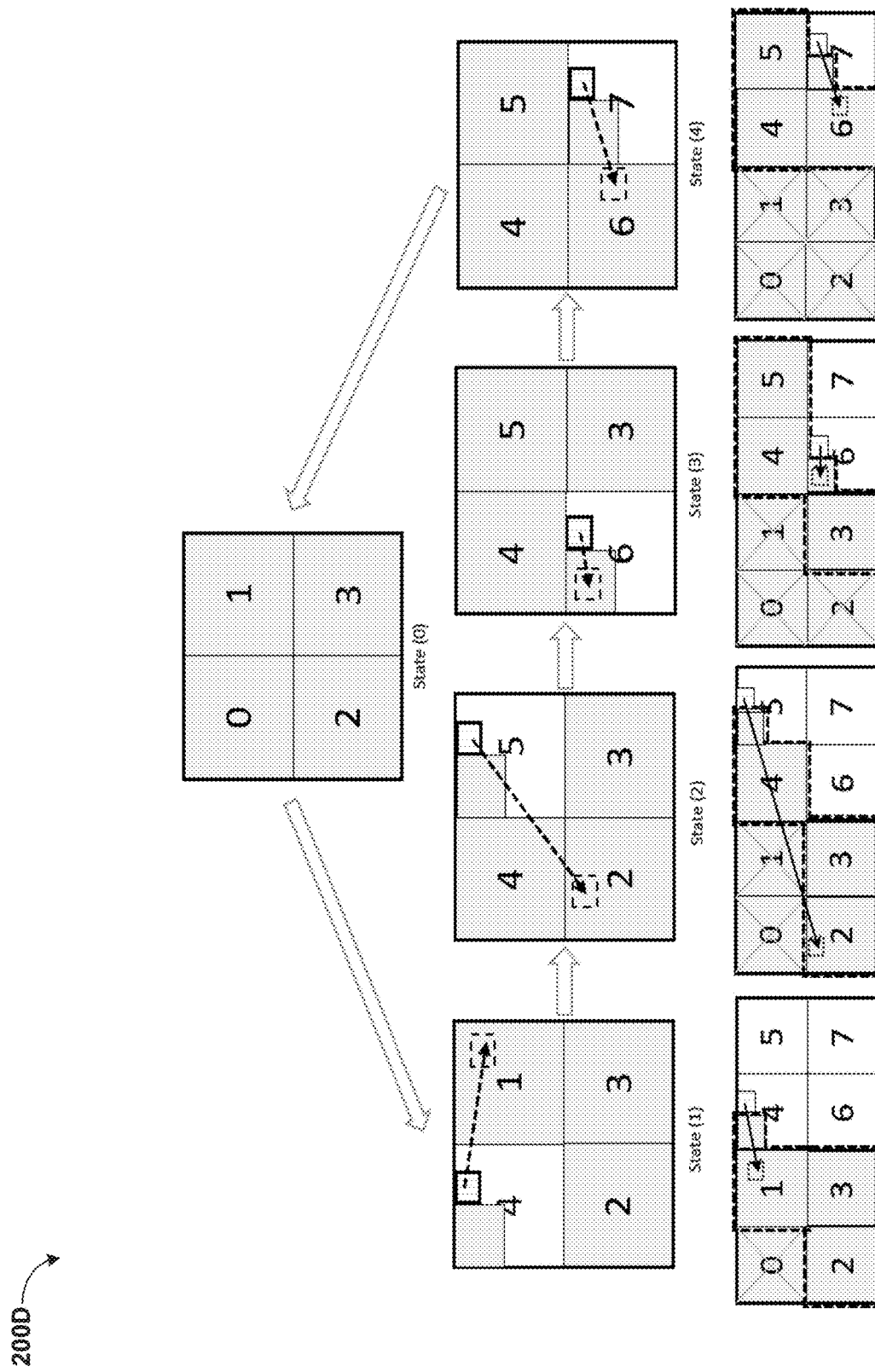
FIG. 2D is a block diagram of reference sample memory update process of IBC mode, according to at least one embodiment.

Referring now to FIG. 2D, a block diagram 200D of a reference sample memory update process of IBC mode is depicted. The term block may be interpreted as a prediction block, a coding block, or a coding unit, i.e. CU. According to one or more embodiments, the same reference sample memory update mechanism for IBC to manage the reference locations update in history list for single value string mode. Assuming the reference sample memory size is the same as a CTU size (128×128 for example). In each state (each 64×64 region of current CTU), the corresponding available reference area are shaded and without an "X." These sample values are also those can be used as prediction values in the single value string mode. Therefore, to properly use only the available values in the history list for single value string mode, the following are a few embodiments to manage the history list considering the available sample ranges. In one embodiment, when reference locations in the history list are no longer available in reference sample memory, the encoder does not choose samples in these locations for single value string mode. This behavior is enforced by stating in the bitstream conformance requirement. In another embodiment, at the start of each 64×64 coding region, remove those samples/locations in history list that are no longer in the reference sample memory (i.e., locations marked with "X"). The removed region in the memory can be either 64×64 in size, or current block size (if larger than 64×64).

According to one or more embodiments, the relative coordinates offset to the top-left corner of a CTU for the representation of reference locations in the history list. Since the reference samples for IBC and string matching should be those stored in the reference sample memory with maximum size of 1 CTU (when CTU size equal to the memory size). Assuming the reference sample memory size is the same as a CTU size (128×128 for example). Reconstructed samples in the left CTU may be used for reference, in addition to the coded samples in current CTU. All available reference samples will not be larger than 1 CTU size in total. That means, samples in the left CTU will be gradually replaced by coded regions in current CTU as the coding process goes in the current CTU. In particular, the update is done each time in 64×64 coding region basis. For a current block with top-left corner's coordinate (Xc, Yc), the ctu size being ctu_size, a reference location (Xr, Yr) for single value string mode. (Xr, Yr) is the relative offset of the reference location in the reference sample memory to the top-left corner of reference sample memory.

The top-left corner of the current CTU (Xctu, Yctu) can be derived as (Xc−Xc % ctu_size, Yc−Yc % ctu_size). The offset (Xc-offset, Yc-offset) from the top-left corner of current CTU to the current block can be derived as (Xc−Xctu, Yc−Yctu). If for current coding block (Xc, Yc), the position (Xr+Xctu, Yr+Yctu) has not been coded yet, then the reference location in picture coordinate can be derived as (Xr+Xctu−ctu_size, Yr+Yctu). Otherwise, if for current coding block (Xc, Yc), the position (Xr+Xctu, Yr+Yctu) has been coded already, then the reference location in picture coordinate can be derived as (Xr+Xctu, Yr+Yctu). Assuming the smallest block size is M×N, then the (Xr, Yr) can be further represented by a multiple of M for Xr and a multiple of N for Yr directions, respectively.

Referring now to FIG. 2E, a block diagram 200E of reference sample memory update process of IBC and string matching is depicted. According to one or more embodiments, when the reference sample memory size for IBC and string matching is larger than the CTU size, more than 1 left CTU can be stored in that memory and used as the reference, in addition to the coded samples in current CTU. For examples, the reference range for IBC and string matching are shown in FIG. 2E, where the block with vertical strip lines is current block and samples in the grey area can be used as reference. For a reference location (Xr, Yr) of single value string mode, the derivation of Yr is similar as above since only samples from current CTU row are available for reference. For Xr derivation, its absolute x coordinate may be used. The reference sample's location information may be updated in the history-based list, when a new string is coded in single value string mode Assuming for a current string with length of N, its samples are located at (X0, Y0), (X1, Y1), . . . , ($X_{N-1}$, $Y_{N-1}$), where (X0, Y0) is the location of the first sample in the string in scanning order. The entry A in the history-based list, or in the history-based candidate set indicating its value has a location (Xr, Yr). After coding of current string, the same entry A will remain in the history-based list by the updating process. The location information of entry A may be modified based on the information of this new string. In one embodiment, (X0, Y0) is used to replace (Xr, Yr). In another embodiment, $(X_{N-1}, Y_{N-1})$ is used to replace (Xr, Yr). In a third embodiment, any sample location (Xi, Yi) in the string can be used to replace (Xr, Yr).

Figure 3:
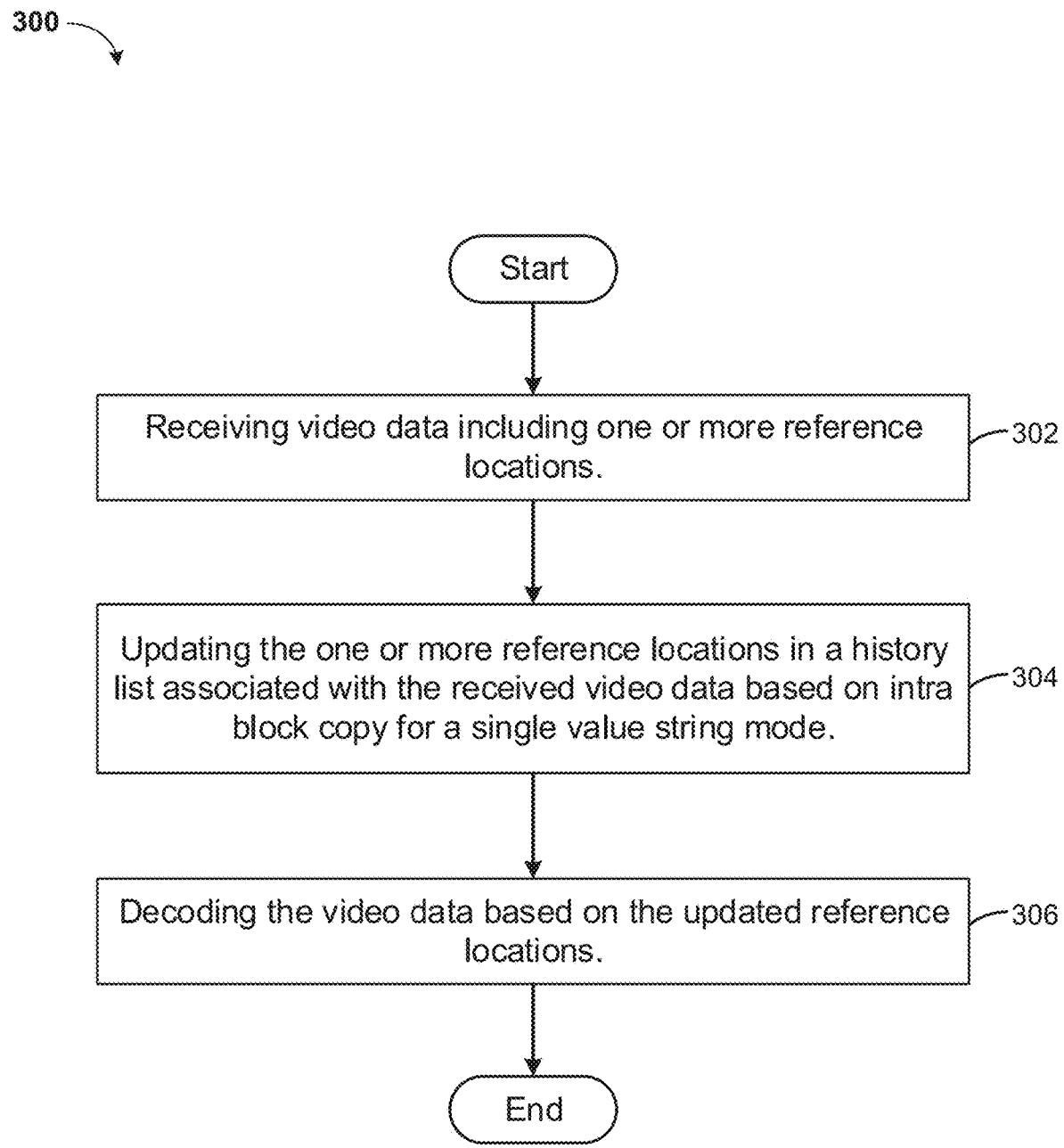
FIG. 3 is an operational flowchart illustrating the steps carried out by a program that encodes and decodes video data based on updating reference locations, according to at least one embodiment.

Referring now to FIG. 3, an operational flowchart illustrating the steps of a method 300 carried out by a program that encodes and decodes video data based on string matching is depicted.

At 302, the method 300 may include receiving video data including one or more reference locations.

At 304, the method 300 may include updating the one or more reference locations in a history list associated with the received video data based on intra block copy for a single value string mode.

At 306, the method 300 may include decoding the video data based on the updated reference locations.

It may be appreciated that FIG. 3 provides only an illustration of one implementation and does not imply any limitations with regard to how different embodiments may be implemented. Many modifications to the depicted environments may be made based on design and implementation requirements.

Figure 4:
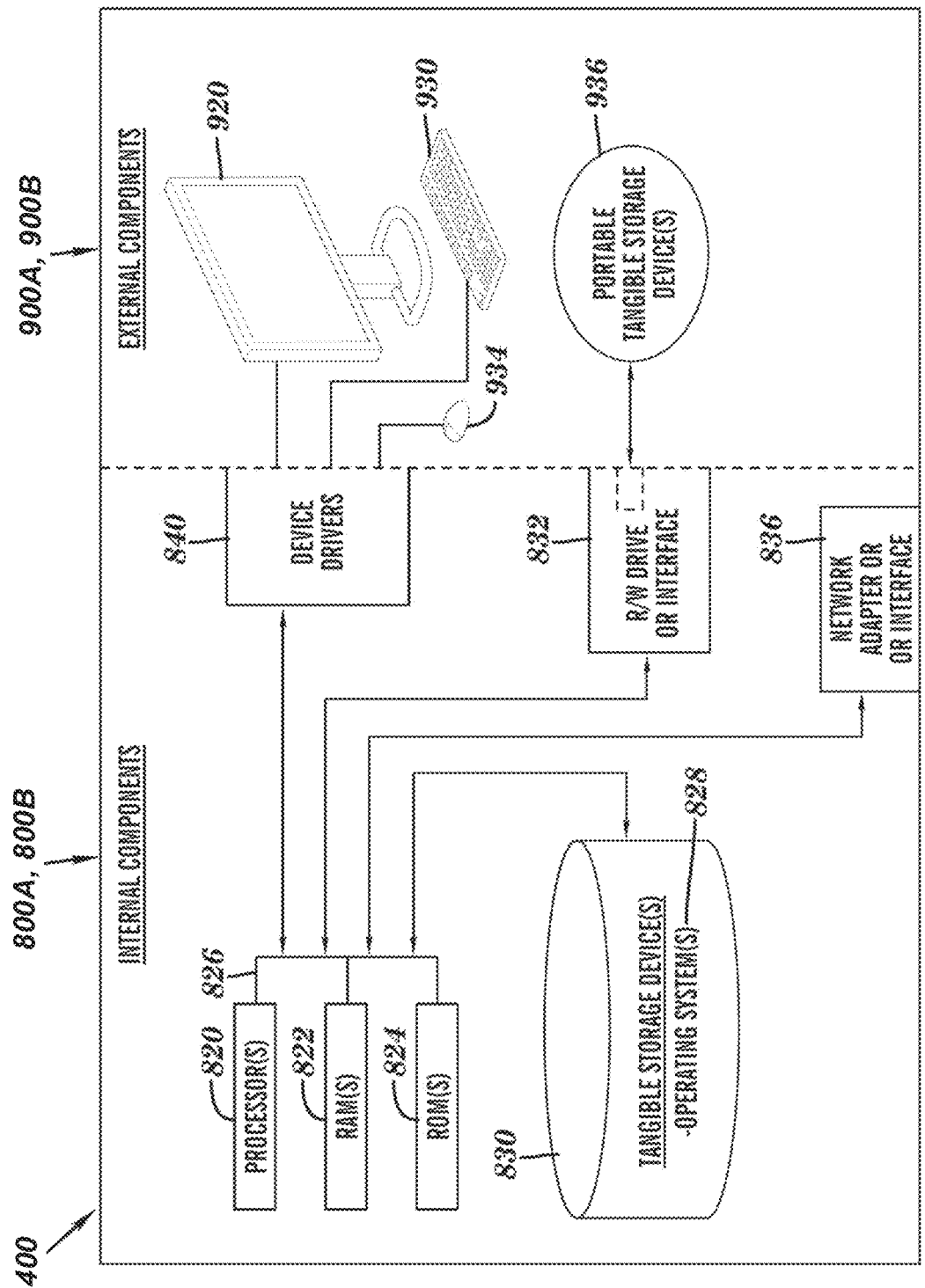
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Figure 5:
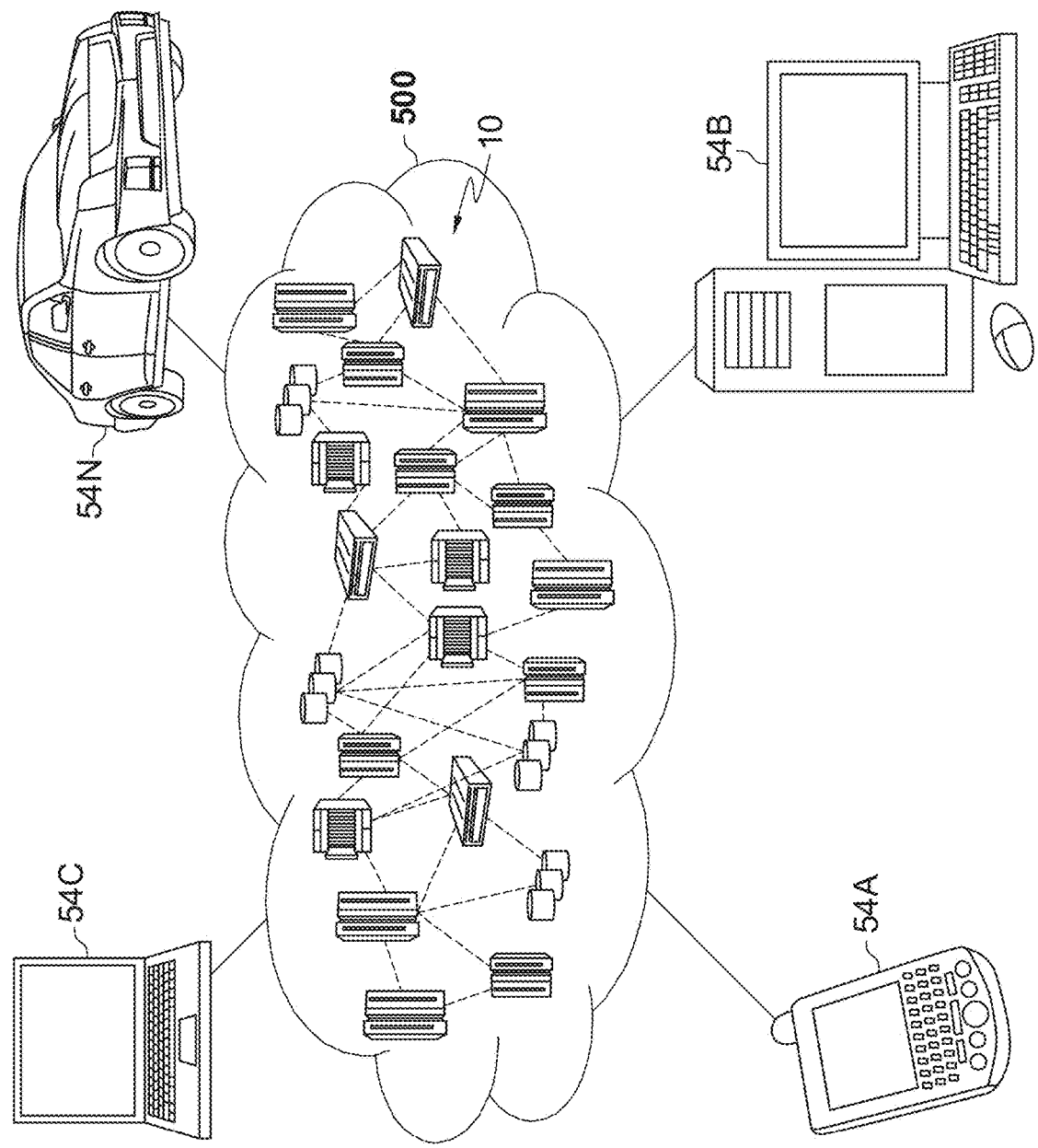
FIG. 5 is a block diagram of an illustrative cloud computing environment including the computer system depicted in FIG. 1, according to at least one embodiment.

Computer 102 (FIG. 1) and server computer 114 (FIG. 1) may include respective sets of internal components 800A,B and external components 900A,B illustrated in FIG. 5. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Video Coding Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Video Coding Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Video Coding Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Video Coding Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
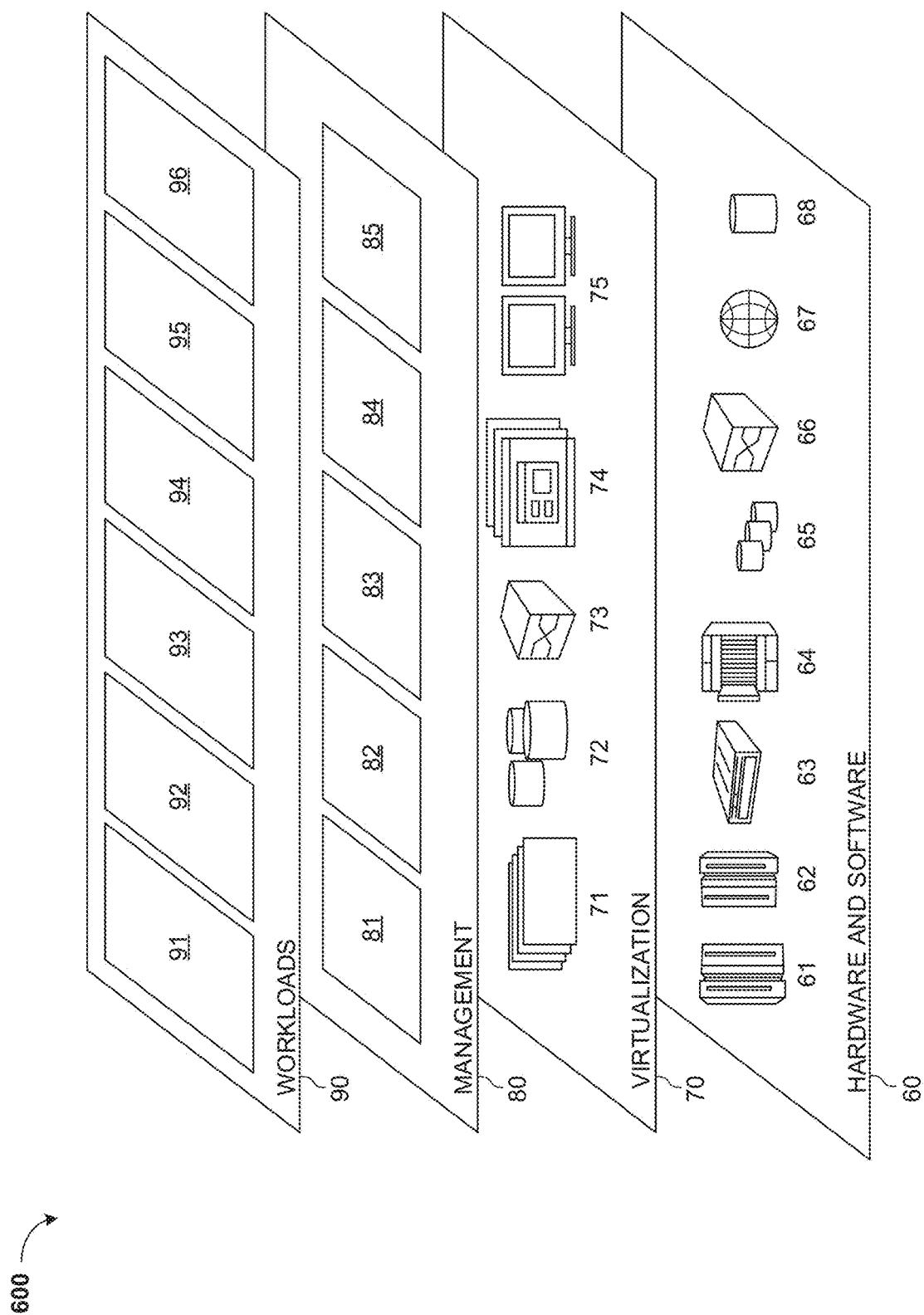
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Video Coding 96. Video Coding 96 may encode and decode video data based on string matching.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of video coding, executable by a processor, comprising:
   receiving video data including one or more reference locations;
   updating the reference locations in a history list associated with the received video data based on intra block copy for a single value string mode; and
   decoding the video data based on the updated reference locations.

2. The method of claim 1, further comprising controlling an encoder to not choose samples in the reference locations for single value string mode based on the reference locations in the history list being no longer available in reference sample memory.

3. The method of claim 2, wherein the encoder is controlled based on providing a bitstream conformance requirement.

4. The method of claim 1, further comprising removing, at a start of a 64-pixel by 64-pixel coding region, one or more reference locations from the history list that are no longer in reference sample memory.

5. The method of claim 4, wherein the remove reference locations are 64 pixels by 64 pixels or a current block size larger than 64 pixels by 64 pixels.

6. The method of claim 1, wherein the reference locations are updated based on updating relative coordinates offset to a top-left corner of a coding tree unit associated with the reference locations in the history list.

7. The method of claim 6, wherein samples for intra block copy and string matching associated with the reference locations are stored in the reference sample memory with a maximum size corresponding to a size of the coding tree unit.

8. The method of claim 7, wherein the samples in a left CTU are replaced by coded regions in a current coding tree unit for each 64-pixel by 64-pixel coding region.

9. The method of claim 1, wherein the reference locations are updated in the history list based on a new string being coded in single value string mode.

10. The method of claim 9, wherein any sample location in the new string is used to update the reference locations.

11. A computer system for video coding, the computer system comprising:
    one or more computer-readable non-transitory storage media configured to store computer program code; and
    one or more computer processors configured to access said computer program code and operate as instructed by said computer program code, said computer program code including:
      receiving code configured to cause the one or more computer processors to receive video data including one or more reference locations;
      updating code configured to cause the one or more computer processors to update the reference locations in a history list associated with the received video data based on intra block copy for a single value string mode; and
      decoding code configured to cause the one or more computer processors to decode the video data based on the updated reference locations.

12. The computer system of claim 11, further comprising controlling code configured to cause the one or more computer processors to control an encoder to not choose samples in the reference locations for single value string mode based on the reference locations in the history list being no longer available in reference sample memory.

13. The computer system of claim 12, wherein the encoder is controlled based on providing a bitstream conformance requirement.

14. The computer system of claim 11, further comprising removing code configured to cause the one or more computer processors to remove, at a start of a 64-pixel by 64-pixel coding region, one or more reference locations from the history list that are no longer in reference sample memory.

15. The computer system of claim 14, wherein the remove reference locations are 64 pixels by 64 pixels or a current block size larger than 64 pixels by 64 pixels.

16. The computer system of claim 11, wherein the reference locations are updated based on updating relative coordinates offset to a top-left corner of a coding tree unit associated with the reference locations in the history list.

17. The computer system of claim 16, wherein samples for intra block copy and string matching associated with the reference locations are stored in the reference sample memory with a maximum size corresponding to a size of the coding tree unit.

18. The computer system of claim 17, wherein the samples in a left CTU are replaced by coded regions in a current coding tree unit for each 64-pixel by 64-pixel coding region.

19. The computer system of claim 11, wherein the reference locations are updated in the history list based on a new string being coded in single value string mode.

20. A non-transitory computer readable medium having stored thereon a computer program for video coding, the computer program configured to cause one or more computer processors to:
- receive video data including one or more reference locations;
- update the reference locations in a history list associated with the received video data based on intra block copy for a single value string mode; and
- decode the video data based on the updated reference locations.

* * * * *